United States Patent
Ishima et al.

(10) Patent No.: US 10,886,063 B2
(45) Date of Patent: Jan. 5, 2021

(54) ELECTRONIC-COMPONENT MANUFACTURING METHOD

(71) Applicant: TDK CORPORATION, Tokyo (JP)

(72) Inventors: Yuya Ishima, Tokyo (JP); Shunji Aoki, Tokyo (JP); Shinichi Kondo, Tokyo (JP); Yasushi Matsuyama, Tokyo (JP); Hajime Azuma, Tokyo (JP); Yusuke Onezawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 217 days.

(21) Appl. No.: 15/906,589

(22) Filed: Feb. 27, 2018

(65) Prior Publication Data

US 2018/0254145 A1 Sep. 6, 2018

(30) Foreign Application Priority Data

Mar. 2, 2017 (JP) .................................. 2017-039508

(51) Int. Cl.
| | | |
|---|---|---|
| H01F 27/28 | (2006.01) | |
| H01F 41/04 | (2006.01) | |
| G03F 7/20 | (2006.01) | |
| B32B 38/00 | (2006.01) | |
| G03F 7/26 | (2006.01) | |
| B32B 37/10 | (2006.01) | |
| H01F 41/10 | (2006.01) | |
| H01F 27/29 | (2006.01) | |

(52) U.S. Cl.
CPC ........... *H01F 41/041* (2013.01); *B32B 37/10* (2013.01); *B32B 38/0036* (2013.01); *G03F 7/2022* (2013.01); *G03F 7/26* (2013.01); *G03F 7/70* (2013.01); *H01F 27/2804* (2013.01); *H01F 27/292* (2013.01); *H01F 41/10* (2013.01); *B32B 2457/00* (2013.01); *H01F 2027/2809* (2013.01)

(58) Field of Classification Search
CPC ........... G03F 7/2022; G03F 7/70; H01F 27/28
See application file for complete search history.

(56) References Cited

U.S. PATENT DOCUMENTS

| | | |
|---|---|---|
| 2003/0029830 A1 | 2/2003 | Takaya et al. |
| 2006/0063351 A1* | 3/2006 | Jain ...................... G02F 1/1362 438/455 |
| 2006/0091534 A1 | 5/2006 | Ohba et al. |
| 2008/0257488 A1 | 10/2008 | Yamano |
| 2010/0052838 A1* | 3/2010 | Matsuta .............. H01F 17/0013 336/200 |
| 2010/0255638 A1 | 10/2010 | Ohba et al. |
| 2012/0227250 A1 | 9/2012 | Yamano |
| 2014/0224418 A1 | 8/2014 | Seko |
| 2015/0170834 A1 | 6/2015 | Yamano |

FOREIGN PATENT DOCUMENTS

| | | |
|---|---|---|
| CN | 1406385 A | 3/2003 |
| CN | 103985532 A | 8/2014 |
| JP | H10-256041 A | 9/1998 |
| JP | 2005-123507 A | 5/2005 |
| JP | 2005-129793 A | 5/2005 |
| JP | 2005-311223 A | 11/2005 |
| JP | 2005-311225 A | 11/2005 |
| JP | 2006-173162 A | 6/2006 |
| JP | 2011-151281 A | 8/2011 |
| JP | 4816971 B2 | 11/2011 |

* cited by examiner

*Primary Examiner* — Daborah Chacko-Davis
(74) *Attorney, Agent, or Firm* — Oliff PLC

(57) ABSTRACT

An electronic-component manufacturing method is for simultaneously manufacturing a plurality of electronic components each including an element body and a conductor. The electronic-component manufacturing method includes the steps of forming laminates to be the plurality of electronic components on a plurality of regions set apart from each other on a surface of a first substrate, releasing the laminates from the plurality of regions, and performing heat treatment to the laminates. The forming the laminates includes a first step of forming element-body patterns on the plurality of regions and a second step of forming conductor patterns on the plurality of regions. The element-body patterns contain a constituent material of the element bodies and are patterned for the plurality of regions. The conductor patterns contain a constituent material of the conductors and are patterned for the plurality of regions.

10 Claims, 13 Drawing Sheets

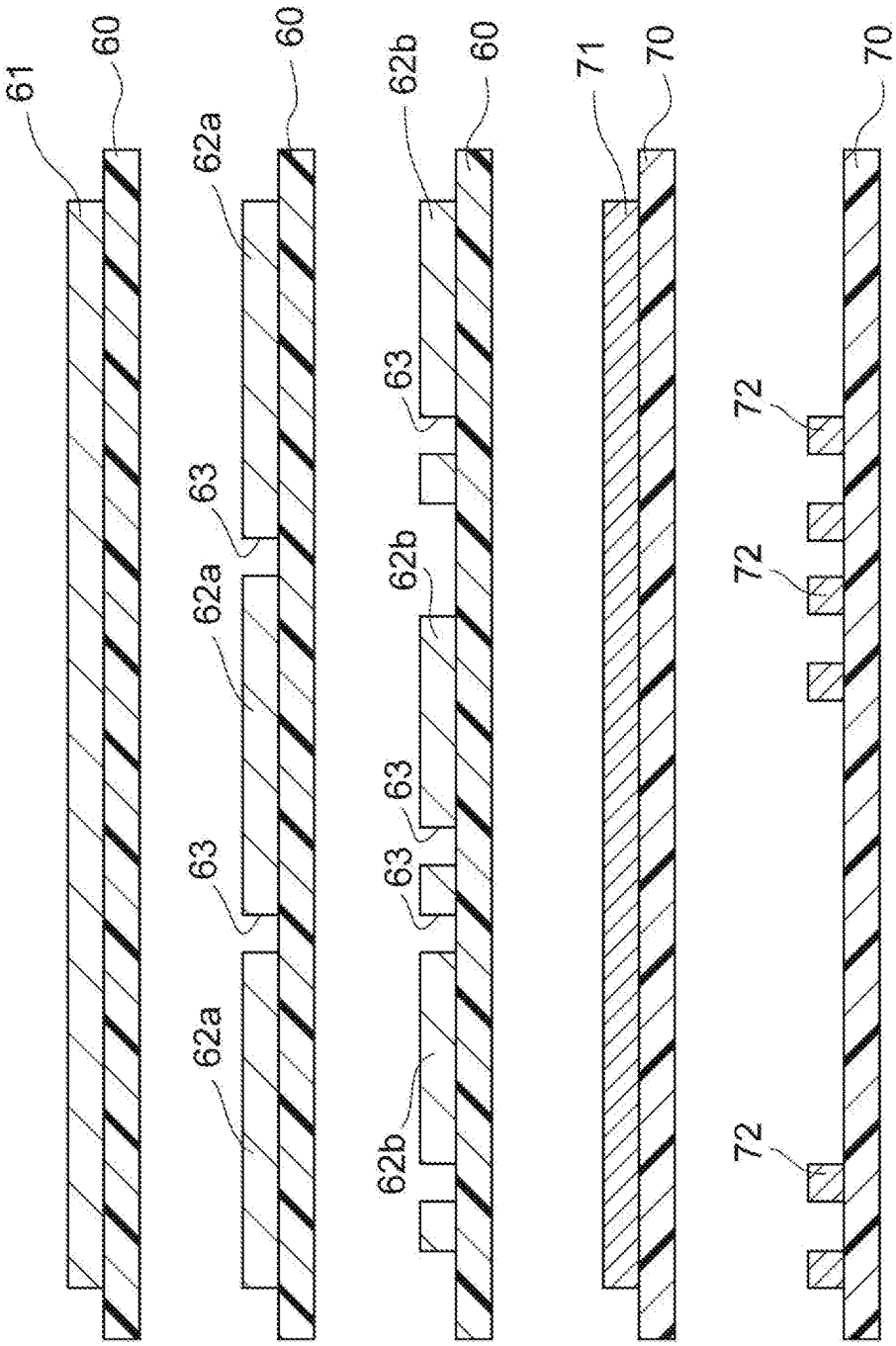

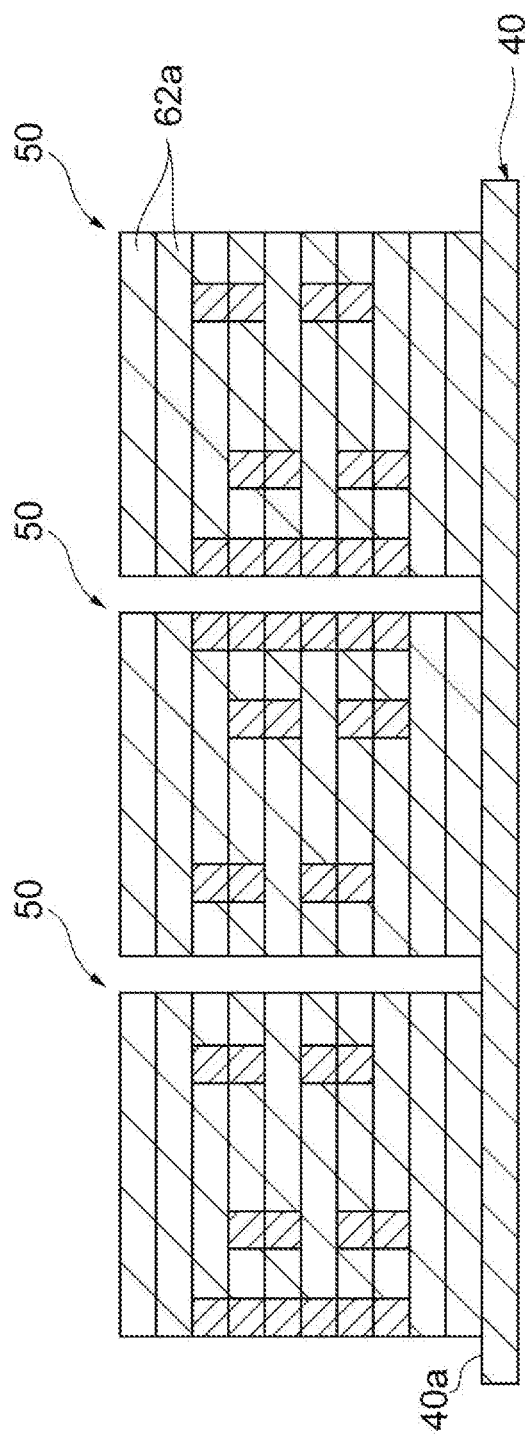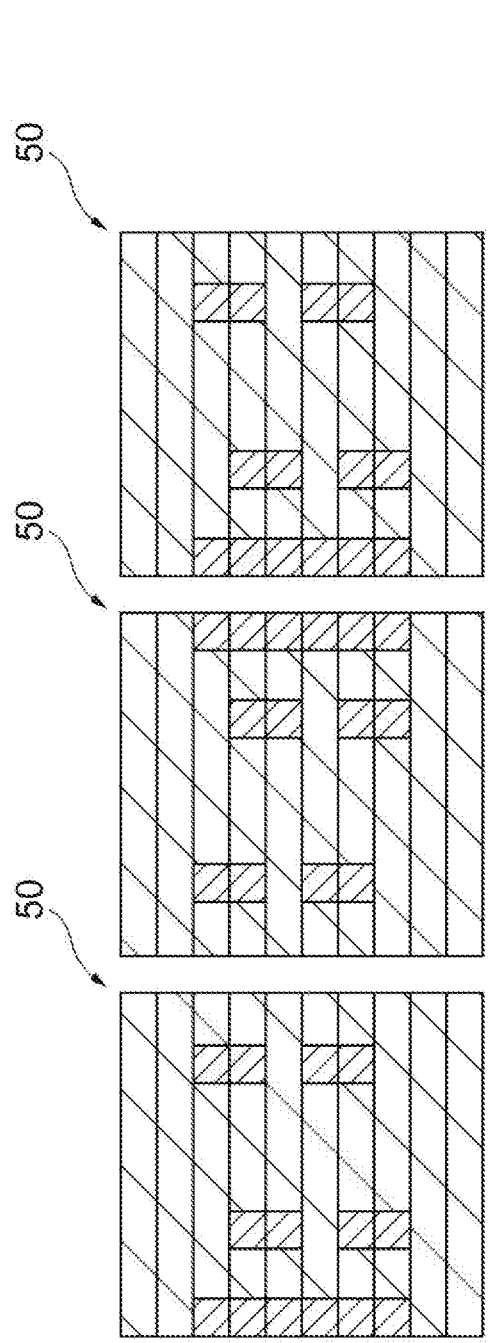
Fig.8A
Fig.8B

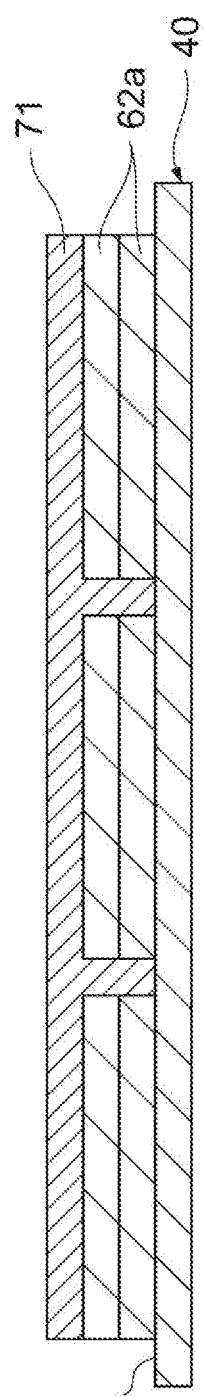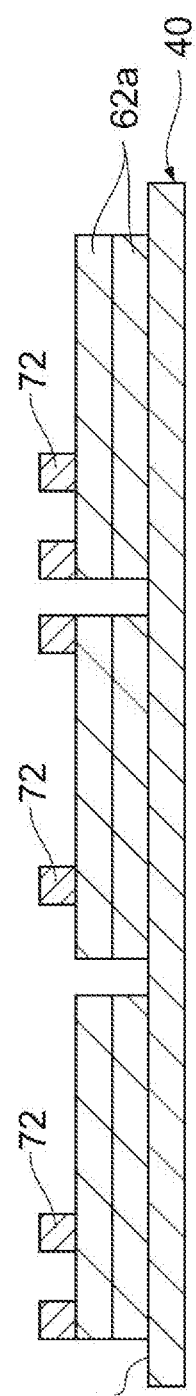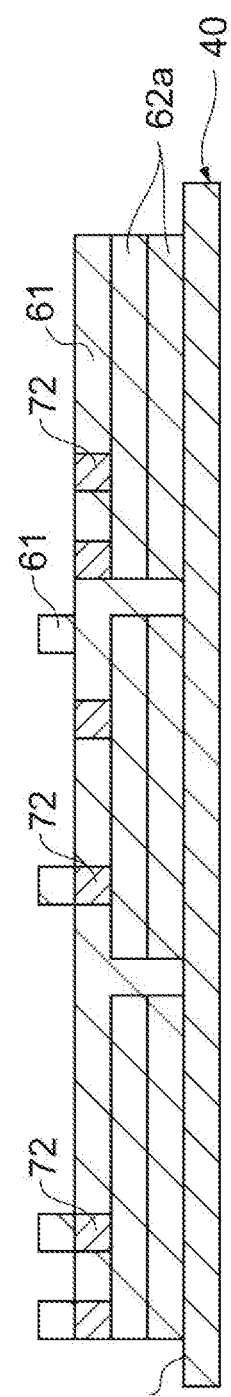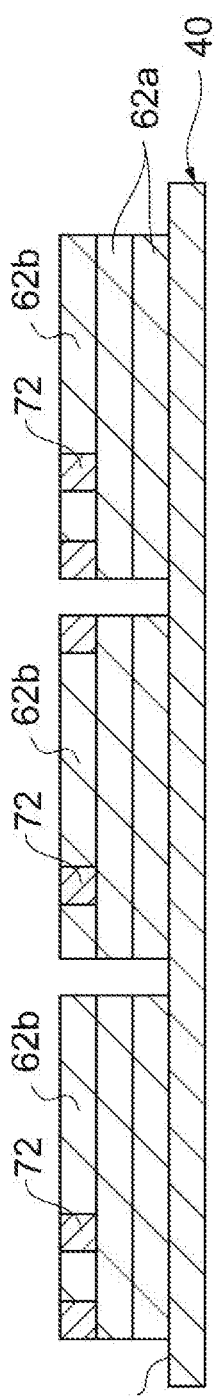

ELECTRONIC-COMPONENT MANUFACTURING METHOD

TECHNICAL FIELD

One aspect of the present invention relates to an electronic-component manufacturing method.

BACKGROUND

Japanese Patent No. 4816971 discloses an electronic-component manufacturing method including a step of forming a laminate having a plurality of chips, a step of cutting the laminate into each chip, and a step of firing the cut chips. In this electronic-component manufacturing method, a pair of external electrodes is formed simultaneously with the chips in the step of forming the laminate, and it is unnecessary to form external electrodes in subsequent steps. Thus, the number of steps can be reduced.

SUMMARY

In the electronic-component manufacturing method disclosed in Japanese Patent No. 4816971, distortion of the laminate can occur due to shearing strain and shearing stress in the step of cutting the laminate. As a result, the yield can decrease.

One aspect of the present invention provides an electronic-component manufacturing method capable of improving a yield.

One aspect of the present invention is an electronic-component manufacturing method for simultaneously manufacturing a plurality of electronic components each including an element body and a conductor. The electronic-component manufacturing method includes the steps of forming laminates to be the plurality of electronic components on a plurality of regions set apart from each other on a surface of a first substrate, releasing the laminates from the plurality of regions, and performing heat treatment to the laminates. The forming the laminates includes a first step of forming element-body patterns on the plurality of regions and a second step of forming conductor patterns on the plurality of regions. The element-body patterns contain a constituent material of the element body and are patterned for the plurality of regions. The conductor patterns contain a constituent material of the conductor and are patterned for the plurality of regions.

In this electronic-component manufacturing method, laminates to be an electronic component are formed on the plurality of regions set apart from each other on a surface of the same substrate. In the step of forming the laminates, element-body patterns and conductor patterns which are patterned for the plurality of regions are formed. Thus, a cutting step for separating laminates from each other is not required. For this reason, it is possible to suppress occurrence of distortion of the laminates due to shearing strain and shearing stress. As a result, it is possible to improve a yield.

In the first step, the element-body patterns may be formed by a photolithography method. In the second step, the conductor patterns may be formed by the photolithography method. In this case, it is possible to form the conductor patterns and the element-body patterns with higher accuracy than, for example, a printing method.

In the first step, after forming the element-body patterns on a second substrate by the photolithography method, the element-body patterns may be transferred onto the plurality of regions. In the second step, after forming the conductor patterns on a third substrate by the photolithography method, the conductor patterns may be transferred onto the plurality of regions. In this case, the conductor patterns and the element-body patterns are formed on the second substrate and the third substrate. The second substrate and the third substrate are different from the first substrate on which the laminates are formed. Thus, residues produced in forming the conductor patterns and element-body patterns are not produced on the first substrate. For this reason, it is possible to omit the step of removing residues from the laminates.

In the first step, after forming a first resist layer containing the constituent material of the element body over the plurality of regions, the first resist layer may be patterned by the photolithography method. In the second step, after forming a second resist layer containing the constituent material of the conductor over the plurality of regions, the second resist layer may be patterned by the photolithography method. In this case, the positional accuracy at the time of lamination is higher than in the case of transferring the conductor patterns and the element-body patterns, which are formed on other substrates, onto the first substrate. Thus, it is possible to suppress positional deviation in the direction orthogonal to the laminating direction.

In the step of forming the laminates, the laminates may be formed on the plurality of regions via a release layer. In this case, it is possible to easily release the laminates from the plurality of regions on the first substrate.

In the step of forming the laminates, the laminates may be formed on the plurality of regions set to have a space of 100 µm or less between each of the plurality of regions. In this case, it is possible to increase the number of electronic components to be manufactured.

In the second step, the conductor patterns may be formed in such a way as to extend along outer edges of the plurality of regions when viewed from a direction orthogonal to the regions. In this case, according to, for example, a manufacturing method in which laminates are integrally formed and then cut, since the element-body pattern and the conductor pattern are included in the cut region, it may be difficult for cutting conditions to optimize for each of the element-body pattern and the conductor pattern. According to this electronic-component manufacturing method, it is possible to improve a yield in such a case.

BRIEF DESCRIPTION OF THE DRAWINGS

FIGS. 6A, 6B, 6C, 6D and 6E are cross-sectional views conceptually showing the method for manufacturing the laminated coil component according to the first embodiment;

FIGS. 8A and 8B are cross-sectional views conceptually showing the method for manufacturing the laminated coil component according to the first embodiment;

FIGS. 11A, 11B, 11C, and 11D are cross-sectional views conceptually showing the method for manufacturing the laminated coil component according to the second embodiment;

DETAILED DESCRIPTION

Hereinafter, embodiments will be described in detail with reference to the accompanying drawings. In the following description, the same reference sign is assigned to the same element or the element having the same function, and the redundant description will be omitted.

First Embodiment (Laminated Coil Component)

Figure 1:
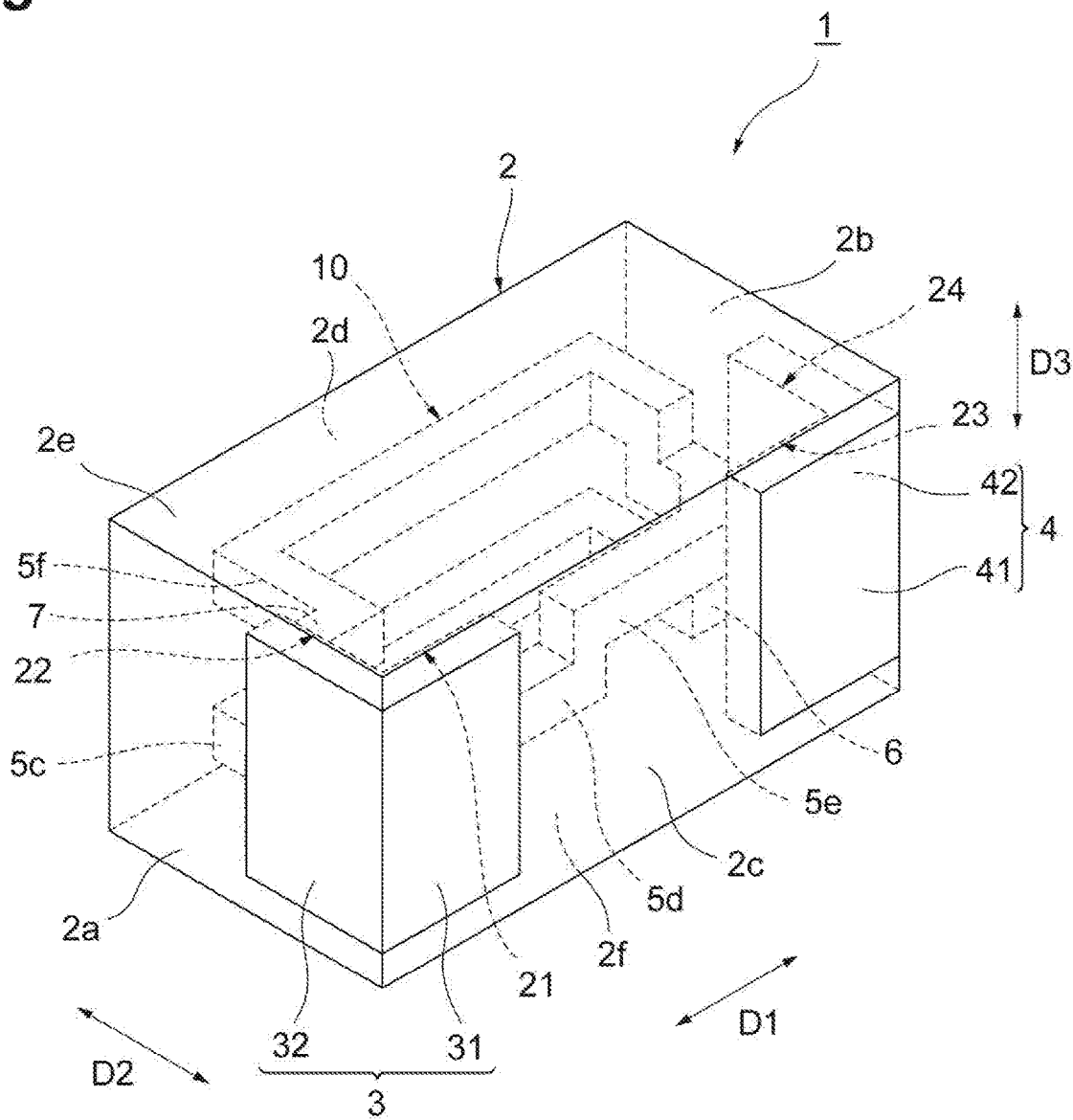
FIG. 1 is a perspective view of a laminated coil component manufactured by a method for manufacturing a laminated coil component according to a first embodiment.
Figure 2:
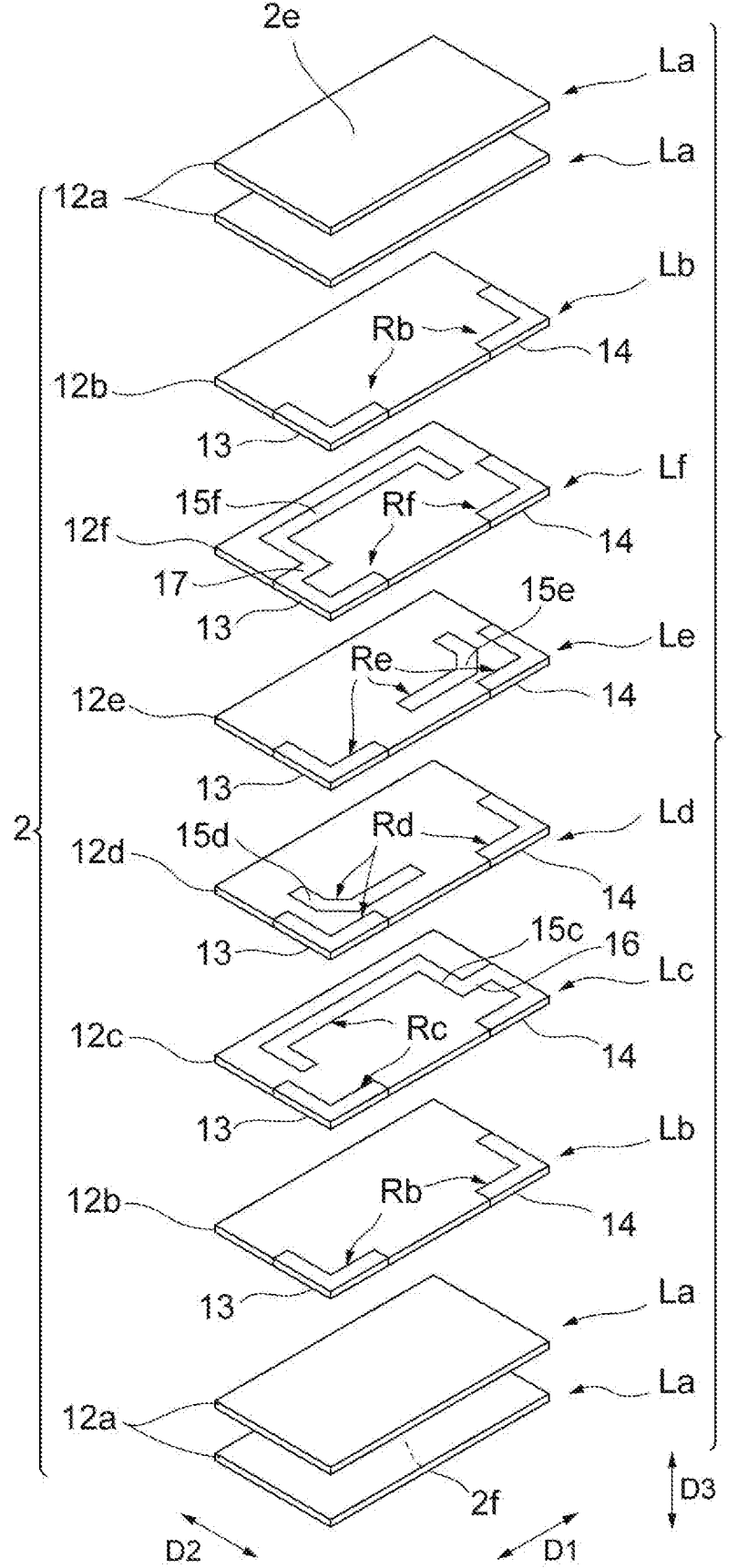
FIG. 2 is an exploded perspective view of the laminated coil component shown in FIG. 1.
Figure 3:
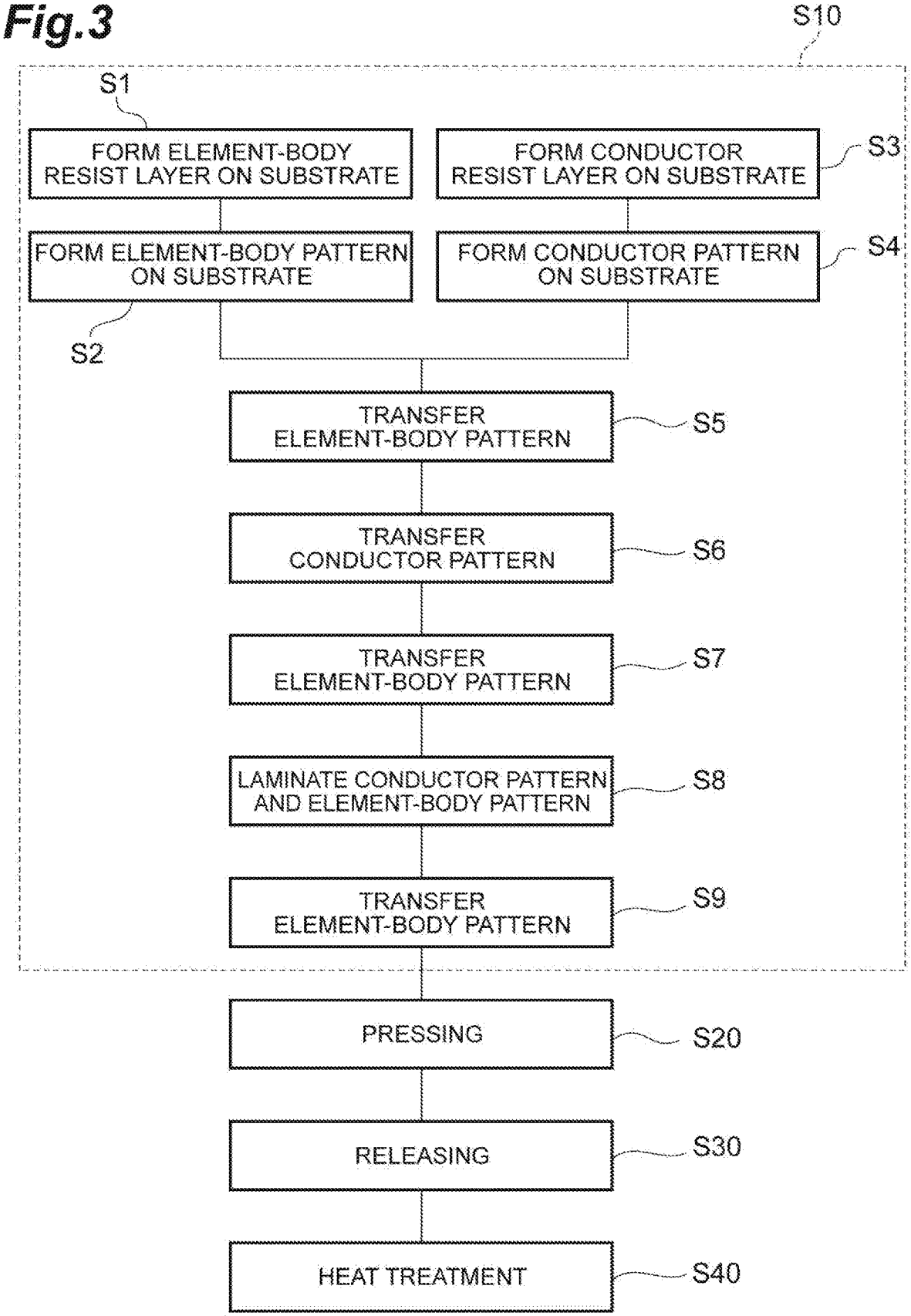
FIG. 3 is a flowchart showing a method for manufacturing the laminated coil component according to the first embodiment.

With reference to FIGS. 1 and 2, a laminated coil component according to a first embodiment will be described. FIG. 1 is a perspective view of a laminated coil component manufactured by a method for manufacturing the laminated coil component according to the first embodiment. FIG. 2 is an exploded perspective view of the laminated coil component shown in FIG. 1.

As shown in FIGS. 1 and 2, a laminated coil component 1 according to the first embodiment includes an element body 2, mounting conductors 3 and 4, a plurality of coil conductors 5c, 5d, 5e, and 5f, and connecting conductors 6 and 7.

The element body 2 has a rectangular parallelepiped shape. The rectangular parallelepiped shape includes a rectangular parallelepiped shape in which the corner portions and the ridge portions are chamfered, and a rectangular parallelepiped shape in which the corner portions and the ridge portions are rounded. The element body 2 has end faces 2a and 2b, and side faces 2c, 2d, 2e, and 2f. The end faces 2a and 2b are opposed to each other. The side faces 2c and 2d are opposed to each other. The side faces 2e and 2f are opposed to each other. In the following description, it is assumed that the opposing direction of the end faces 2a and 2b is a direction D1, that the opposing direction of the side faces 2c and 2d is a direction D2, and that the opposing direction of the side faces 2e and 2f is a direction D3. The direction D1, the direction D2, and the direction D3 are substantially orthogonal to each other.

The end faces 2a and 2b extend in the direction D2 in such a way as to connect the side faces 2c and 2d. The end faces 2a and 2b also extend in the direction D3 in such a way as to connect the side faces 2e and 2f. The side faces 2c and 2d extend in the direction D1 in such a way as to connect the end faces 2a and 2b. The side faces 2c and 2d also extend in the direction D3 in such a way as to connect the side faces 2e and 2f. The side faces 2e and 2f extend in the direction D2 in such a way as to connect the side faces 2c and 2d. The side faces 2e and 2f also extend in the direction D1 in such a way as to connect the end faces 2a and 2b.

The side face 2c is a mounting surface and is opposed to another electronic device, which is not shown, (for example, a circuit substrate or an electronic component) when, for example, the laminated coil component 1 is mounted on the electronic device. The end faces 2a and 2b are continuous faces from the mounting surface (that is, the side face 2c).

The length of the element body 2 in the direction D1 is longer than the length of the element body 2 in the direction D2 and the length of the element body 2 in the direction D3. The length of the element body 2 in the direction D2 and the length of the element body 2 in the direction D3 are equivalent to each other. That is, in the present embodiment, the end faces 2a and 2b each have a square shape, and the side faces 2c, 2d, 2e, and 2f each have a rectangular shape. The length of the element body 2 in the direction D1 may be equivalent to the length of the element body 2 in the direction D2 and to the length of the element body 2 in the direction D3, or may be shorter than these lengths. The length of the element body 2 in the direction D2 and the length of the element body 2 in the direction D3 may be different from each other.

In the present embodiment, the term "equivalent" may include, in addition to being equal, a value including a slight difference or a manufacturing error in a preset range. For example, if a plurality of values is included within the range of ±5% of the average value of the values, the values are defined to be equivalent.

Recesses 21, 22, 23, and 24 are provided in the element body 2. The recesses 21 and 22 are integrally provided and correspond to the mounting conductor 3. The recesses 23 and 24 are integrally provided and correspond to the mounting conductor 4.

The recess 21 is provided on the end face 2a side of the side face 2c, and is recessed toward the side face 2d. The recess 22 is provided on the side face 2c side of the end face 2a, and is recessed toward the end face 2b. The recess 23 is provided on the end face 2b side of the side face 2c, and is recessed toward the side face 2d. The recess 24 is provided on the side face 2c side of the end face 2b, and is recessed toward the end face 2a. The recesses 21, 22, 23, and 24 have, for example, the same shape. The recesses 21, 22, 23, and 24 are provided apart from the side faces 2d, 2e, and 2f. The recess 21 and the recess 23 are provided apart from each other in the direction D1.

The element body 2 includes a plurality of element-body layers 12a to 12f laminated in the direction D3. A specific laminated structure will be described later. In the actual element body 2, the element-body layers 12a to 12f are integrated in such a way that no boundaries between the layers can be visually recognized. The element-body layers 12a to 12f are made of, for example, a magnetic material (Ni—Cu—Zn-based ferrite material, Ni—Cu—Zn—Mg-based ferrite material, Ni—Cu-based ferrite material, or the like). The magnetic material constituting the element-body layers 12a to 12f may contain Fe alloy or the like. The element-body layers 12a to 12f may be made of a non-magnetic material (a glass ceramic material, a dielectric material, or the like).

The mounting conductor 3 is disposed in the recesses 21 and 22. The mounting conductor 4 is disposed in the recesses 23 and 24. The mounting conductors 3 and 4 are apart from each other in the direction D1. The mounting conductors 3 and 4 have, for example, the same shape. The mounting conductors 3 and 4 each have, for example, an L-shaped cross section. It can be also described that the mounting conductors 3 and 4 each have, for example, an L shape when viewed from the direction D3. The mounting conductors 3 and 4 may have plating layers on the outer surfaces by applying electrolytic plating or electroless plating. The plating layers contain Ni, Sn, Au or the like.

The mounting conductor 3 includes a plurality of mounting conductor layers 13 laminated in the direction D3. Each mounting conductor layer 13 has an L shape when viewed from the direction D3. In the actual mounting conductor 3, the mounting conductor layers 13 are integrated in such a way that no boundaries between the layers can be visually recognized. The mounting conductor 3 has integrally formed conductor portions 31 and 32. The conductor portions 31 and 32 each have a substantially rectangular plate shape. The conductor portions 31 and 32 have, for example, the same shape. The conductor portion 31 is disposed in the recess 21. The conductor portion 32 is disposed in the recess 22.

The mounting conductor 4 includes a plurality of mounting conductor layers 14 laminated in the direction D3. Each mounting conductor layer 14 has an L shape when viewed from the direction D3. In the actual mounting conductor 4, the mounting conductor layers 14 are integrated in such a way that no boundaries between the layers can be visually recognized. The mounting conductor 4 has integrally formed conductor portions 41 and 42. The conductor portions 41 and 42 each have a substantially rectangular plate shape. The conductor portions 41 and 42 have, for example, the same shape. The conductor portion 41 is disposed in the recess 23. The conductor portion 42 is disposed in the recess 24.

The coil conductors 5c, 5d, 5e, and Hare connected to each other to form a coil 10 in the element body 2. The coil conductors 5c, 5d, 5e, and 5f are disposed in such a way as to at least partially overlap each other when viewed from the direction D3. The coil conductors 5c, 5d, 5e, and 5f are disposed apart from the end faces 2a and 2b and the side faces 2c, 2d, 2e, and 2f.

The coil conductor 5c constitutes a first end portion of the coil 10. A first end portion of the coil conductor 5c and the connecting conductor 6 are adjacent to each other in the direction D1, and are connected to each other. A second end portion of the coil conductor 5c and a first end portion of the coil conductor 5d are adjacent to each other in the direction D3, and connected to each other. A second end portion of the coil conductor 5d and a first end portion of the coil conductor 5e are adjacent to each other in the direction D3, and connected to each other. A second end portion of the coil conductor 5e and a first end portion of the coil conductor 5f are adjacent to each other in the direction D3, and connected to each other. A second end portion of the coil conductor 5f and the connecting conductor 7 are adjacent to each other in the direction D1, and connected to each other.

The coil conductor 5c includes a plurality of coil conductor layers 15c laminated in the direction D3. The coil conductor 5d includes a plurality of coil conductor layers 15d laminated in the direction D3. The coil conductor 5e includes a plurality of coil conductor layers 15e laminated in the direction D3. The coil conductor 5f includes a plurality of coil conductor layers 15f laminated in the direction D3. The plurality of the coil conductor layers 15c are disposed in such way as to entirely overlap each other when viewed from the direction D3. The plurality of the coil conductor layers 15d are disposed in such way as to entirely overlap each other when viewed from the direction D3. The plurality of the coil conductor layers 15e are disposed in such way as to entirely overlap each other when viewed from the direction D3. The plurality of the coil conductor layers 15f are disposed in such way as to entirely overlap each other when viewed from the direction D3. The coil conductor 5c may be constituted by a coil conductor layer 15c. The coil conductor 5d may be constituted by a coil conductor layer 15d. The coil conductor 5e may be constituted by a coil conductor layer 15e. The coil conductor 5f may be constituted by a coil conductor layer 15f. FIG. 2 shows one each of the plurality of the coil conductor layers 15c, the plurality of the coil conductor layers 15d, the plurality of the coil conductor layers 15e, and the plurality of the coil conductor layers 15f. In the actual coil conductor 5c, the plurality of the coil conductor layers 15c are integrated in such a way that no boundaries between the layers can be visually recognized. In the actual coil conductor 5d, the plurality of the coil conductor layers 15d are integrated in such a way that no boundaries between the layers can be visually recognized. In the actual coil conductor 5e, the plurality of the coil conductor layers 15e are integrated in such a way that no boundaries between the layers can be visually recognized. In the actual coil conductor 5f, the plurality of the coil conductor layers 15f are integrated in such a way that no boundaries between the layers can be visually recognized.

The connecting conductor 6 extends in the direction D1, and is connected to the coil conductor 5c of the coil 10 and the conductor portion 42. The connecting conductor 7 extends in the direction D1, and is connected to the coil conductor 5f and the conductor portion 32. The connecting conductor 6 includes a plurality of connecting conductor layers 16 laminated in the direction D3. The connecting conductor 7 includes a plurality of connecting conductor layers 17 laminated in the direction D3. In FIG. 2, one of the plurality of the connecting conductor layers 16 and one of the plurality of the connecting conductor layers 17 are shown. In the actual connecting conductor 6, the plurality of the connecting conductor layers 16 are integrated in such a way that no boundaries between the layers can be visually recognized. In the actual connecting conductor 7, the plurality of the connecting conductor layers 17 are integrated in such a way that no boundaries between the layers can be visually recognized.

The mounting conductor layers 13 and 14, the coil conductor layers 15c, 15d, 15e, and 15f, and the connecting conductor layers 16 and 17 are made of a conductive material (for example, Ag or Pd). Each layer may be made of the same material or different materials. Each layer has a substantially rectangular cross section.

The laminated coil component 1 has layers La, Lb, Lc, Ld, Le, and Lf. For example, the laminated coil component 1 is constituted by laminating, from the side face 2f side, two layers La, one layer Lb, three layers Lc, three layers Ld, three layers Le, three layers Lf, one layer Lb, and two layers La, in this order. FIG. 2 shows one of the three layers but not the other two layers for each of the three layers Lc, the three layers Ld, the three layers Le, and the three layers Lf.

The layer La is constituted by the element-body layer 12a.

The layer Lb is constituted by combining the element-body layer 12b and the mounting conductor layers 13 and 14 with each other. The element-body layer 12b is provided with a defect portion Rb into which the mounting conductor layers 13 and 14 are fitted. The defect portion Rb has shapes corresponding to the respective shapes of the mounting conductor layers 13 and 14. The element-body layer 12b and the mounting conductor layers 13 and 14 have mutually complementary relationship as a whole.

The layer Lc is constituted by combining the element-body layer 12c, the mounting conductor layers 13 and 14, and the coil conductor layer 15c with each other. The element-body layer 12c is provided with a defect portion Re into which the mounting conductor layers 13 and 14, the coil conductor layer 15c, and the connecting conductor layer 16 are fitted. The defect portion Rc has shapes corresponding to the respective shapes of the mounting conductor layers 13 and 14, the coil conductor layer 15c, and the connecting conductor layer 16. The element-body layer 12c, the mounting conductor layers 13 and 14, the coil conductor layer 15c, and the connecting conductor layer 16 have mutually complementary relationship as a whole.

The layer Ld is constituted by combining the element-body layer 12d, the mounting conductor layers 13 and 14, and the coil conductor layer 15d with each other. The element-body layer 12d is provided with a defect portion Rd into which the mounting conductor layers 13 and 14, and the coil conductor layer 15d are fitted. The defect portion Rd has shapes corresponding to the respective shapes of the mounting conductor layers 13 and 14, and the coil conductor layer 15d. The element-body layer 12d, the mounting conductor layers 13 and 14, and the coil conductor layer 15d have mutually complementary relationship as a whole.

The layer Le is constituted by combining the element-body layer 12e, the mounting conductor layers 13 and 14, and the coil conductor layer 15e with each other. The element-body layer 12e is provided with a defect portion Re into which the mounting conductor layers 13 and 14, and the coil conductor layer 15e are fitted. The defect portion Re has shapes corresponding to the respective shapes of the mounting conductor layers 13 and 14, and the coil conductor layer 15e. The element-body layer 12e, the mounting conductor layers 13 and 14, and the coil conductor layer 15e have mutually complementary relationship as a whole.

The layer Lf is constituted by combining the element-body layer 12f, the mounting conductor layers 13 and 14, the coil conductor layer 15f, and the connecting conductor layer 17 with each other. The element-body layer 12f is provided with a defect portion Rf into which the mounting conductor layers 13 and 14, the coil conductor layer 15f, and the connecting conductor layer 17 are fitted. The defect portion Rf has shapes corresponding to the respective shapes of the mounting conductor layers 13 and 14, the coil conductor layer 15f, and the connecting conductor layer 17. The element-body layer 12f, the mounting conductor layers 13 and 14, the coil conductor layer 15f, and the connecting conductor layer 17 have mutually complementary relationship as a whole.

The defect portions Rb, Rc, Rd, Re, and Rf are integrated to constitute the recesses 21, 22, 23, and 24. The widths of the defect portions Rb, Rc, Rd, Re, and Rf (hereinafter, the width of the defect portion) are basically set in such a way as to be wider than the those of the mounting conductor layers 13 and 14, the coil conductor layers 15c, 15d, 15e, 15f, and the connecting conductor layers 16 and 17 (hereinafter, the width of the conductor portion). The width of the defect portion may be intentionally set in such a way as to be narrower than the width of the conductor portion in order for the element-body layers 12b, 12c, 12d, 12e, and 12f to adhere to the mounting conductor layers 13 and 14, the coil conductor layers 15c, 15d, 15e, and 15f, and the connecting conductor layers 16 and 17 more firmly. The value obtained by subtracting the width of the conductor portion from the width of the defect portion may be, for example, −3 µm or more and 10 µm or less. The value may be, for example, 0 µm or more and 10 µm or less.

(Method for Manufacturing Laminated Coil Components)

With reference to FIGS. 3, 4, 5, 6A, 6B, 6C, 6D, 6E, 7A, 7B, 7C, 7D, 8A, and 8B, the method for manufacturing the laminated coil component 1 according to the first embodiment will be described. The cross-sectional view of FIG. 6A or the like is conceptually shown, and does not necessarily correspond to the cross-sectional view of the actual laminated coil component 1.

Figure 4:
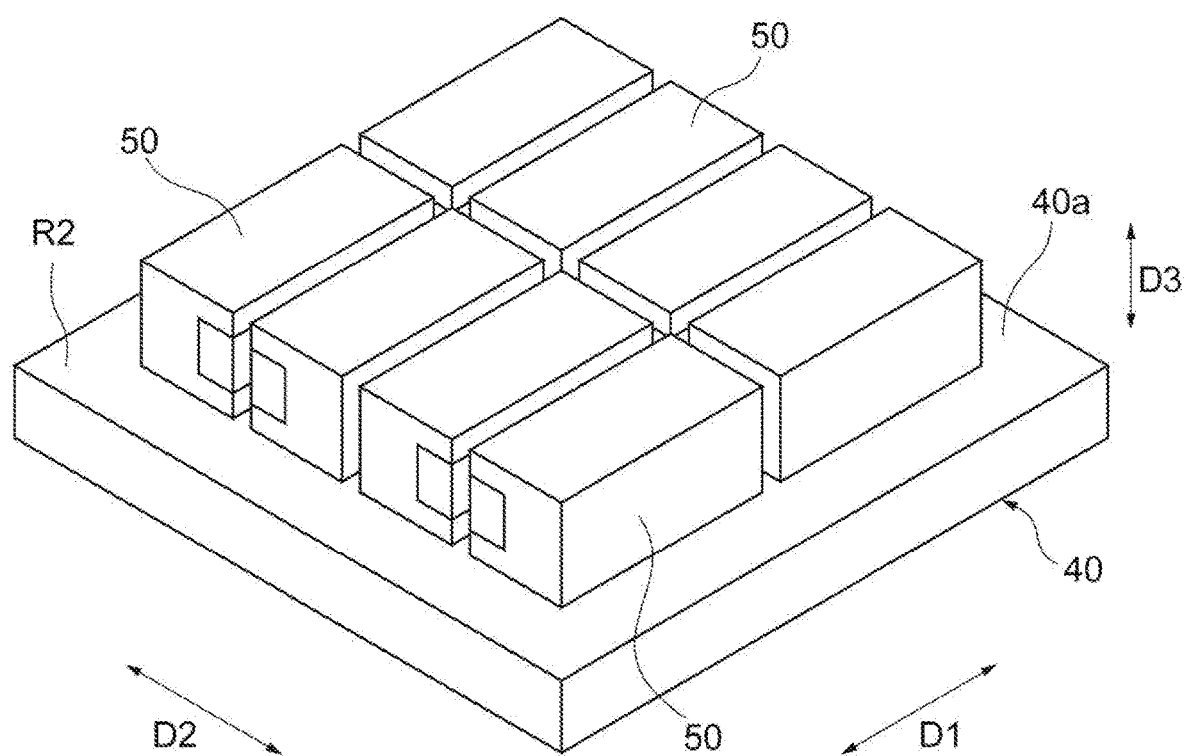
FIG. 4 is a perspective view of a laminate.
Figure 5:
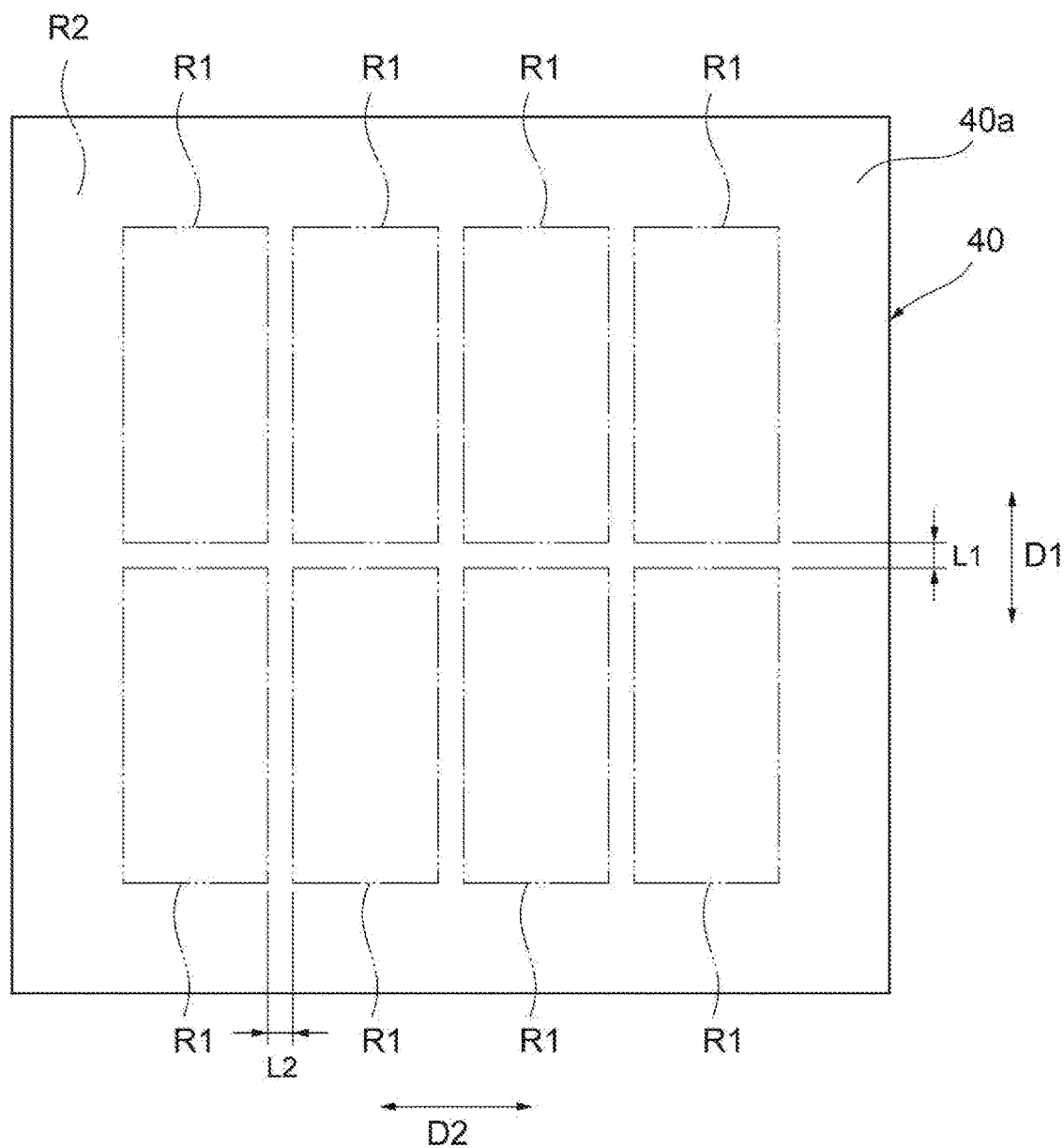
FIG. 5 is a plan view of a substrate.

In the method for manufacturing the laminated coil component 1 according to the first embodiment, a plurality of laminated coil components 1 is simultaneously manufactured. First, as shown in FIGS. 4 and 5, on a surface 40a of a substrate 40, laminates 50 to be the laminated coil components 1 through steps to be described later is formed on each of a plurality of (here, eight) regions R1 set apart from each other (step S10). The regions R1 are a region on which the laminates 50 are formed. The surface 40a of the substrate 40 has a plurality of regions R1 and a region R2 disposed around the regions R1. The region R2 constitutes the entire surface 40a except for the regions R1.

The regions R1 each have, for example, the same shape as the side face 2f (see FIG. 1). The regions R1 are arranged in the direction D1 and the direction D2. In the regions R1, a space L1 between the two adjacent regions R1 in the direction D1 and a space L2 between the two adjacent regions R1 in the direction D2 are set in such a way as to be, for example, 100 µm or less, and more preferably 10 µm or more and 50 µm or less. In other words, the regions R1 are arranged in such a way that the length in the direction D1 of the region R2 disposed between the two adjacent regions R1 in the direction D1, and the length in the direction D2 of the region R2 disposed between the two adjacent regions R1 in the direction D2 are set to be, for example, 100 µm or less, and more preferably 10 µm or more and 50 µm or less.

The spaces L1 and L2 may be equivalent to each other or different from each other. The regions R1 may be arranged at equal intervals or at different intervals in the direction D1. That is, the space L1 may be fixed or may not be fixed. The regions R1 may be arranged at equal intervals or at different intervals in the direction D2. That is, the space L2 may be fixed or may not be fixed.

The two adjacent laminates 50 in the direction D1 are disposed in such a way that the surface to be the end face 2a after heat treatment and the surface to be the end face 2b after the heat treatment are opposed to each other. For this reason, the portion to be the conductor portion 32 of the mounting conductor 3 after the heat treatment and the portion to be the conductor portion 42 of the mounting conductor 4 after the heat treatment are opposed to each other. The two adjacent laminates 50 in the direction D2 are disposed in such a way that the surfaces to be the side faces 2c after the heat treatment are opposed to each other. For this reason, the portion to be the conductor portion 31 of the mounting conductor 3 after the heat treatment and the portion to be the conductor portion 41 of the mounting conductor 4 after the heat treatment are opposed to each other. In this manner, in the two adjacent laminates 50, the portion to be the mounting conductor 3 after the heat treatment and the portion to be the mounting conductor 4 after the heat treatment are opposed to each other.

Specifically, the laminates 50 are formed as follows. First, as shown in FIG. 6A, an element-body resist layer 61 is formed on a substrate 60 (step S1). The substrate 60 is, for example, a PET film. The element-body resist layer 61 contains, for example, the constituent material of the element-body layers 12a to 12f. The element-body resist layer 61 is formed by, for example, applying an element-body paste containing the constituent material of the element-body layers 12a to 12f and a photosensitive material on the substrate 60. The photosensitive material contained in the element-body paste may be either a negative type or a positive type, and a known photosensitive material can be used.

Next, as shown in FIGS. 6B and 6C, the element-body resist layer 61 is exposed and developed by, for example, a photolithography method using a Cr mask, and then an element-body pattern 62a and an element-body pattern 62b which are patterned for each of the regions R1 are formed on the substrate 60 (step S2). The element-body patterns 62a and 62b are formed so as not to protrude from each of the regions R1 when overlapped with each of the regions R1. The element-body pattern 62a is formed in such a way as to have the shape of the region R1 when viewed from the direction orthogonal to the region R1. The element-body pattern 62b is formed in such a way as to be smaller than the region R1 when viewed from the direction orthogonal to the region R1.

Note that, the term "to pattern" in the present embodiment means to physically form an object in a predetermined shape, and does not mean to virtually set an object to a predetermined shape. The step S2 includes a case in which the element-body pattern 62a or the element-body pattern 62b is patterned for each of the regions R1 by patterning a conductor pattern 72 to be described later (see FIG. 6E) for each of the regions R1, and then patterning the element-body pattern 62a or the element-body pattern 62b for each conductor pattern 72.

The element-body patterns 62a are formed in such a way as to be physically apart from each other on each of the regions R1. The element-body patterns 62a are formed by removing the shape corresponding to the shape of the region R2 (see FIG. 5) when viewed from the direction orthogonal to the surface of the substrate 60. The element-body patterns 62b are formed in such a way as to be physically apart from each other on each of the regions R1. The element-body patterns 62b are formed by removing the shapes corresponding to the shape of the conductor pattern 72 to be described later (see FIG. 6E) and to the shape of the region R2 when viewed from the direction orthogonal to the surface of the substrate 60. The element-body patterns 62a and 62b may be formed on different substrates 60, or may be formed on a common substrate 60 as long as they are apart from each other. The "photolithography method" in the present embodiment is only required to be a method for forming a desired pattern by exposing and developing a layer to be patterned containing a photosensitive material, and is not limited to the type of mask or the like.

The element-body pattern 62a is a pattern to be the element-body layer 12a through steps to be described later. The element-body pattern 62b is a pattern to be the element-body layers 12b to 12f through steps to be described later. That is, in the step S2, the element-body pattern 62a provided with the defect portion 63 corresponding to the region R2, and the element-body pattern 62b provided with the defect portion 63 corresponding to the region R2 or the defect portions Rc, Rd, Re, and Rf are formed.

On the other hand, as shown in FIG. 6D, a conductor resist layer 71 is formed on a substrate 70 (step S3). The substrate 70 is, for example, a PET film. The conductor resist layer 71 contains, for example, the constituent material of the mounting conductor layers 13 and 14, the coil conductor layers 15c, 15d, 15e, and 15f, and the connecting conductor layers 16 and 17. The conductor resist layer 71 is formed by, for example, applying a conductor paste containing the constituent material of the mounting conductor layers 13 and 14, the coil conductor layers 15c, 15d, 15e, and 15f, and the connecting conductor layers 16 and 17, and a photosensitive material on the substrate 70. The photosensitive material contained in the conductor paste may be either a negative type or a positive type, and a known photosensitive material can be used.

Next, as shown in FIG. 6E, the conductor resist layer 71 is exposed and developed by, for example, a photolithography method using a Cr mask. For this reason, the conductor pattern 72 patterned for each of the regions R1 is formed on the substrate 70 (step S4). The conductor pattern 72 is formed so as not to protrude from each of the regions R1 when overlapped with each of the regions R1. The conductor pattern 72 is formed in such a way as to be smaller than the region R1 when viewed from the direction orthogonal to the region R1. The conductor pattern 72 is a layer to be the mounting conductor layers 13 and 14, the coil conductor layers 15c, 15d, 15e, and 15f, and the connecting conductor layers 16 and 17 through steps to be described later. The conductor patterns 72 are formed in such a way as to be physically apart from each other on each of the regions R1. The step S4 includes a case in which the conductor pattern 72 is patterned for each of the regions R1 by patterning the element-body pattern 62a or the element-body pattern 62b for each of the regions R1, and then patterning the conductor pattern 72 for the element-body pattern 62a or the element-body pattern 62b.

Figure 7A:
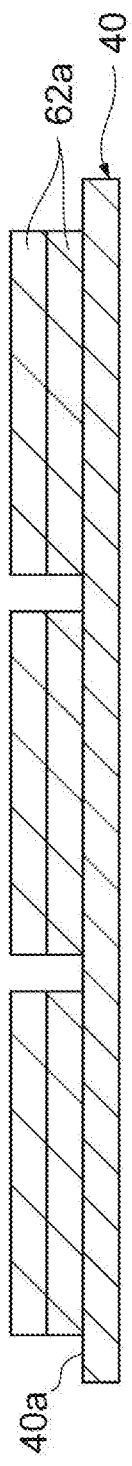
FIGS. 7A, 7B, 7C, and 7D are cross-sectional views conceptually showing the method for manufacturing the laminated coil component according to the first embodiment.

Then, as shown in FIG. 7A, the element-body pattern 62a is formed on each of the regions R1 (step S5). Specifically, the element-body pattern 62a formed in the step S2 is transferred from the substrate 60 onto each of the regions R1. Since the element-body pattern 62a is formed by the photolithography method in the step S2, it can be also described that the element-body pattern 62a is formed on each of the regions R1 by the photolithography method. By repeating the step S5 a plurality of times, a plurality of element-body patterns 62a may be laminated on each of the regions R1. In the present embodiment, by repeating the step S5 twice, two layers of the element-body patterns 62a are laminated on each of the regions R1. These element-body patterns 62a are layers to be the layers La after the heat treatment.

Figure 7B:
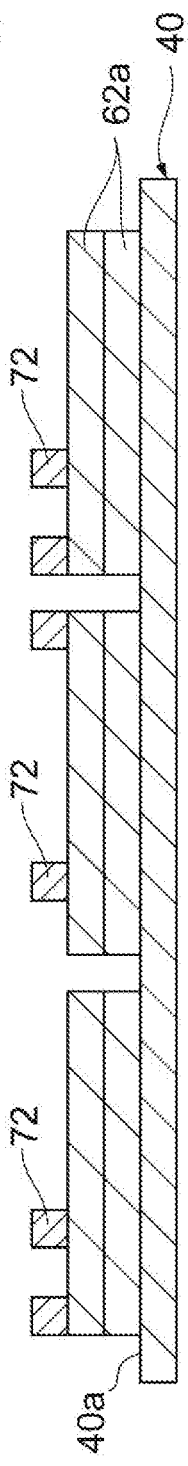

Then, as shown in FIG. 7B, the conductor pattern 72 is formed on each of the regions R1 (step S6). Specifically, on the element-body pattern 62a formed in the step S5, the conductor pattern 72 formed in the step S4 is transferred from the substrate 70 onto the region R1. Since the conductor pattern 72 is formed by the photolithography method in the step S4, it can be also described that the conductor pattern 72 is formed on each of the regions R1 by the photolithography method. On the element-body pattern 62a, the portion of the conductor pattern 72 to be the mounting conductor layers 13 and 14 (see FIG. 2) is formed in such a way as to extend along the outer edge of the region R1 when viewed from the direction orthogonal to the region R1. In the two adjacent regions R1, the portions of the conductor pattern 72 to be the mounting conductor layers 13 and 14 are formed in such a way as to be opposed to each other via the region R2 when viewed from the direction orthogonal to the region R1. For this reason, as described above, in the two adjacent laminates 50, the portion to be the mounting conductor 3 after the heat treatment and the portion to be the mounting conductor 4 after the heat treatment are opposed to each other.

Figure 7C:
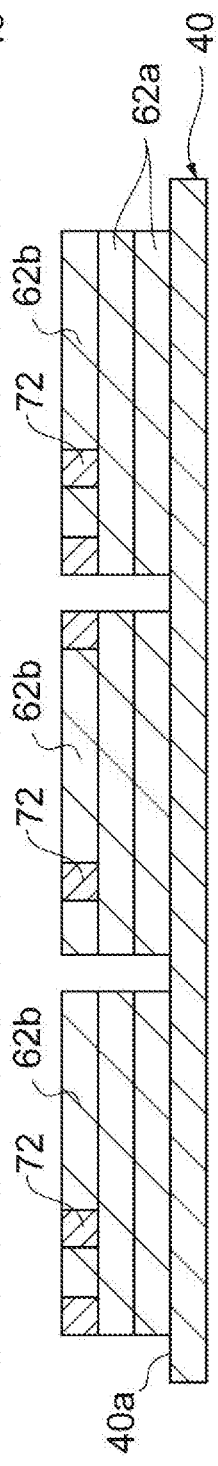

Next, as shown in FIG. 7C, the element-body pattern 62b is formed on each of the regions R1 (step S7). Specifically, on the element-body pattern 62a formed in the step S5, the element-body pattern 62b formed in the step S2 is transferred from the substrate 60 onto the region R1. Since the element-body pattern 62b is formed by the photolithography method in the step S2, it can be also described that the element-body pattern 62b is formed on each of the regions R1 by the photolithography method in the step S7. The conductor pattern 72 formed in the step S6 is combined with the defect portion 63 of the element-body pattern 62b, and the element-body pattern 62b and the conductor pattern 72 are in the same layer.

Figure 7D:
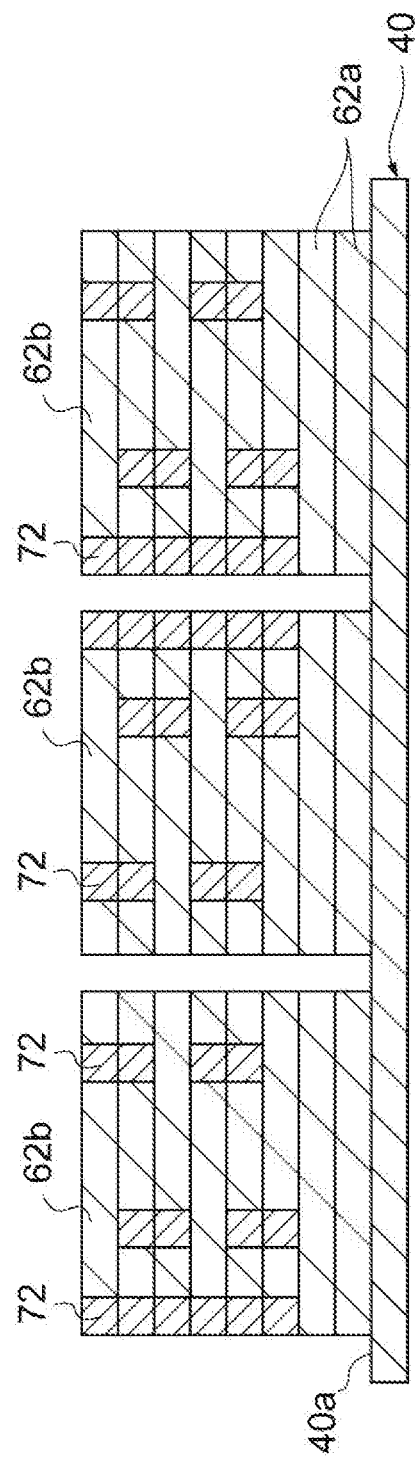
Figure 9:
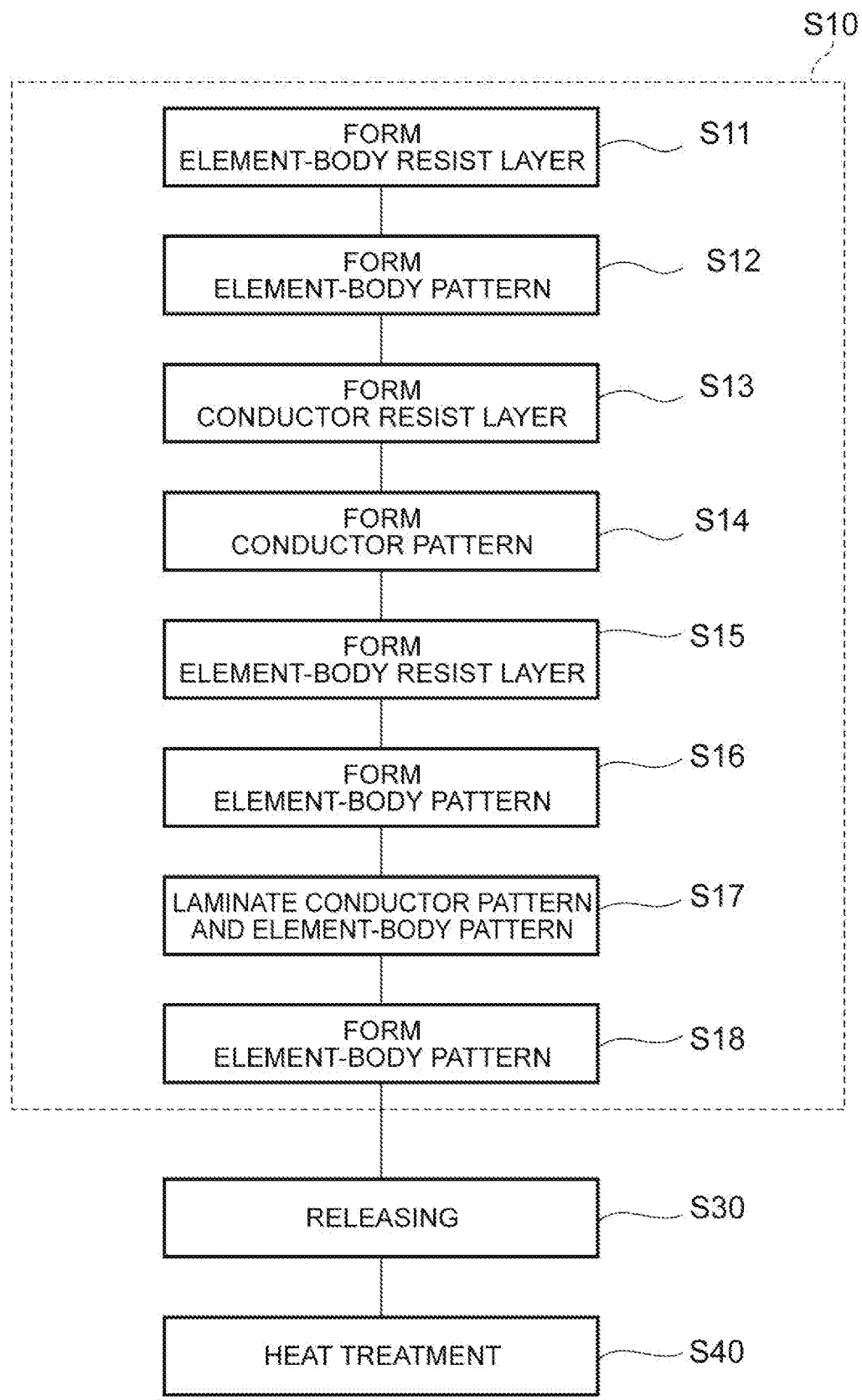
FIG. 9 is a flowchart showing a method for manufacturing a laminated coil component according to a second embodiment.

In addition, as shown in FIG. 7D, by repeating the steps S6 and S7, the element-body pattern 62b and the conductor pattern 72 are laminated in the direction D3 (see FIG. 1) in a state of being combined with each other (step S8). For this reason, the layers to be the layers Lb, Lc, Ld, Le, and Lf after the heat treatment are laminated. Noted that, in the step S8, the steps S6 and S7 are not necessarily repeated on a one-to-one basis, and the step S6 may be repeated more than the step S7, for example. Thus, the conductor pattern 72 corresponding only to the mounting conductor layers 13 and 14 may be redundantly transferred onto the element-body pattern 62b, for example.

Then, as shown in FIG. 8A, the element-body pattern 62a is formed on each of the regions R1 (step S9). Specifically, the element-body pattern 62a formed in the step S2 is transferred from the substrate 60 onto the layer laminated in the step S8. Since the element-body pattern 62a is formed by the photolithography method in the step S2, it can be also described that the element-body pattern 62a is formed on each of the regions R1 by the photolithography method. By repeating the step S9 a plurality of times, a plurality of element-body patterns 62a may be laminated on the layer. In the present embodiment, by repeating the step S9 twice, two layers of the element-body patterns 62a are laminated on the layer. These element-body patterns 62a are layers to be the layers La after the heat treatment.

In the above manner, the laminates 50 are formed on each of the regions R1. Note that, for example, a layer provided with a cutting mark or a mark indicating the directivity of a chip (the laminated coil component 1), or a colored layer may be further laminated as necessary to form the laminates 50.

Next, the laminates 50 are pressed in the direction D3 (step S20). As a pressing method, isotropic pressing such as warm isostatic pressing (WIP), or uniaxial pressing is used, for example. The adjacent conductor pattern 72 and element-body patterns 62a and 62b can thereby adhere closely to each other, for example. In addition, it is possible to suppress gaps in each of the laminates 50 produced due to a difference in level between the conductor pattern 72 and the element-body pattern 62b which are to be the same layer, for example.

Next, as shown in FIG. 8B, the laminates 50 are released from the region R1 (step S30). Then, the laminates 50 are subjected to the heat treatment (step S40). Specifically, for example, each of the laminates 50 is subjected to binder removal treatment, and then is subjected to the heat treatment (step S40). The temperature of the heat treatment is, for example, about 850 to 900° C. The step S30 may be performed after the step S40. Then, as necessary, electrolytic plating or electroless plating is applied to the mounting conductors 3 and 4 to form plating layers on the outer surfaces of the mounting conductors 3 and 4. The laminated coil component 1 is thereby obtained.

As described above, in the present embodiment, the laminates 50 to be the laminated coil components 1 are formed on each of the regions R1 set apart from each other on the common surface 40a of the same substrate 40. In the step S10, the element-body patterns 62a and 62b, and the conductor pattern 72 which are patterned for each of the regions R1 are formed. Thus, a cutting step for separating the laminates 50 from each other is not required. For this reason, it is possible to suppress occurrence of distortion of the laminate 50 due to shearing strain and shearing stress. As a result, it is possible to improve a yield. In addition, since the cutting process is omitted, manufacturing efficiency is improved.

In the present embodiment, all the element-body patterns 62a and 62b and the conductor pattern 72 are formed by the photolithography method. Thus, it is possible to form the element-body patterns 62a and 62b, and the conductor pattern 72 with higher accuracy than, for example, a printing method.

In the present embodiment, all the element-body patterns 62a and 62b, and the conductor pattern 72 are formed on the substrates 60 and 70 that are different from the substrate 40 on which the laminates 50 are formed. Thus, residues produced in forming the element-body patterns 62a and 62b, and the conductor pattern 72 by the photolithography method are not produced on the substrate 40. For this reason, it is possible to omit the step of removing residues from the laminate 50.

In the present embodiment, the laminates 50 are formed on each of the regions R1 set in such a way that the spaces L1 and L2 are 100 μm or less between each of the regions R1. Thus, it is possible to increase the number of the laminated coil components 1 to be manufactured per unit area of the substrate 40.

Second Embodiment

With reference to FIGS. 4, 5, 9, 10A, 10B, 10C, 10D, 11A, 11B, 11C, 11D, 12A, and 12B, a method for manufacturing a laminated coil component 1 according to a second embodiment will be described. The cross-sectional view of FIG. 10A or the like is conceptually shown, and does not necessarily correspond to the cross-sectional view of the actual laminated coil component 1. The laminated coil component 1 manufactured by the manufacturing method according to the second embodiment has the same configuration as the laminated coil component 1 manufactured by the manufacturing method according to the first embodiment.

The manufacturing method according to the second embodiment is different from the manufacturing method according to the first embodiment in the specific procedure of the step S10 to form laminates 50 and in that the step S20 is not included. In the following description, these differences will be mainly described.

Figure 10A:
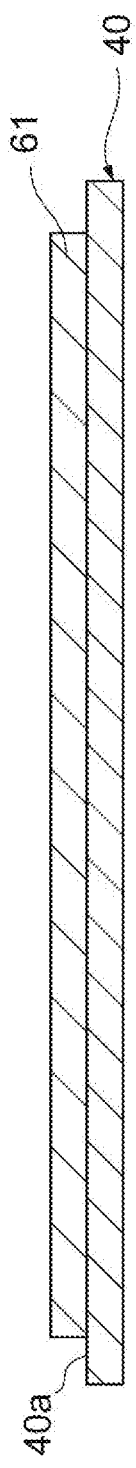
FIGS. 10A, 10B, 10C, and 10D are cross-sectional views conceptually showing the method for manufacturing the laminated coil component according to the second embodiment.
Figure 10B:
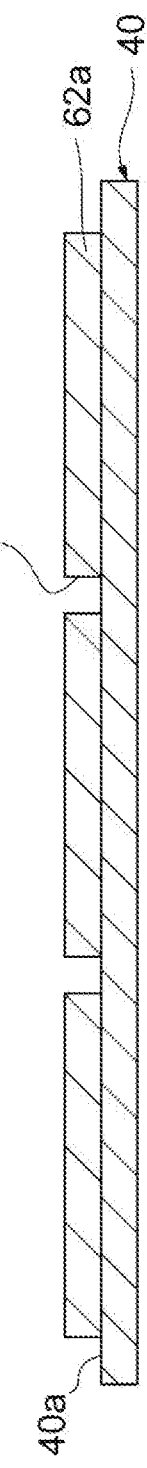
Figure 10C:
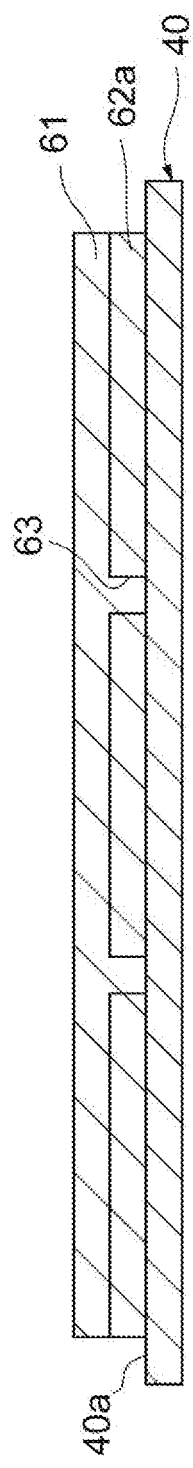
Figure 10D:
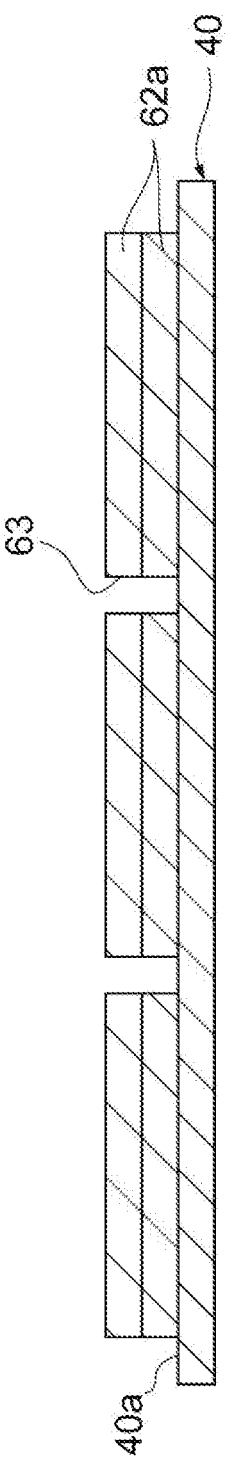

Specifically, in the step S10, the laminates 50 are formed as follows. First, as shown in FIG. 10A, on a surface 40a of a substrate 40, an element-body resist layer 61 is formed over a plurality of regions R1 (step S11). The element-body resist layer 61 is formed by, for example, applying an element-body paste on the surface 40a. Thereafter, as shown in FIG. 10B, the element-body resist layer 61 is patterned for each of the regions R1 by, for example, a photolithography method using a Cr mask (step S12). Through the steps S11 and S12, an element-body pattern 62a from which the shape corresponding to the shape of a region R2 (see FIG. 5) is removed is formed when viewed from the direction orthogonal to the regions R1. As shown in FIGS. 10C and 10D, by repeating the steps S11 and S12, a plurality of element-body patterns 62a may be laminated on each of the regions R1. In the present embodiment, by repeating the steps S11 and S12 alternately twice, two layers of the element-body patterns 62*a* are laminated on each of the regions R1. These element-body patterns 62*a* are layers to be the layers La after the heat treatment.

Then, as shown in FIG. 11A, on the surface 40*a* of the substrate 40, a conductor resist layer 71 is formed over a plurality of regions R1 (step S13). The conductor resist layer 71 is formed, for example, by applying a conductor paste. Specifically, the conductor resist layer 71 is formed on the surface of the element-body pattern 62*a* formed in the steps S11 and S12, and on the region R2. The conductor resist layer 71 is formed in such a way as to fill a defect portion 63 of the element-body pattern 62*a*. Thereafter, as shown in FIG. 11B, the conductor resist layer 71 is patterned for each of the regions R1 by, for example, a photolithography method using a Cr mask (step S14). Through the steps S13 and S14, the conductor pattern 72 is formed on each of the regions R1.

Then, as shown in FIG. 11C, on the surface 40*a* of the substrate 40, the element-body resist layer 61 is formed over a plurality of regions R1 (step S15). The element-body resist layer 61 is formed, for example, by applying an element-body paste. Specifically, the element-body resist layer 61 is formed on the surface of the element-body pattern 62*a* formed in the steps S11 and S12, on the surface of the conductor pattern 72 formed in the steps S13 and S14, and on the region R2. The element-body resist layer 61 is formed in such a way as to fill the defect portion 63 of the element-body pattern 62*a* and the periphery of the conductor pattern 72.

Thereafter, as shown in FIG. 11D, the element-body resist layer 61 is patterned for each of the regions R1 by, for example, a photolithography method using a Cr mask (step S16). The element-body pattern 62*b* from which the shapes corresponding to the shape of the conductor pattern 72 to be described later and to the shape of the region R2 are removed is thereby formed on each of the regions R1 when viewed from the direction orthogonal to the region R1. The conductor pattern 72 formed in the step S14 is combined with the defect portion 63 of the element-body pattern 62*b*, and the element-body pattern 62*b* and the conductor pattern 72 are in the same layer.

Figure 12A:
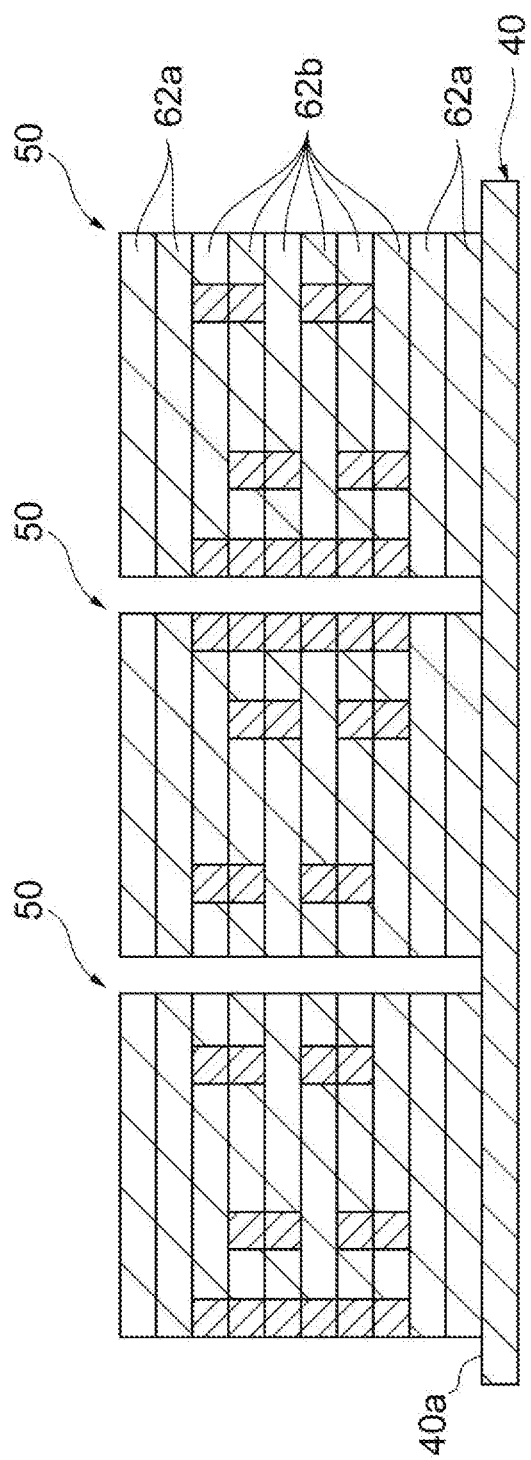
FIGS. 12A and 12B are cross-sectional views conceptually showing the method for manufacturing the laminated coil component according to the second embodiment.

Next, as shown in FIG. 12A, by repeating the steps S13 to S16 in order, the element-body pattern 62*b* and the conductor pattern 72 are laminated in the direction D3 (see FIG. 1) in a state of being combined with each other (step S17). For this reason, the layers to be the layers Lb, Lc, Ld, Le, and Lf after the heat treatment are laminated. Then, the element-body pattern 62*a* is laminated on the layer laminated in the step S17 (step S18). Specifically, similarly to the steps S1 and S2, after the element-body resist layer 61 is formed, the element-body resist layer 61 is patterned by the photolithography method to form the element-body pattern 62*a*. By repeating the step S18 a plurality of times, a plurality of element-body patterns 62*a* may be laminated on the layer. In the present embodiment, by repeating the step S18 twice, two layers of the element-body patterns 62*a* are laminated on the layer. These element-body patterns 62*a* are layers to be the layers La after the heat treatment.

Figure 12B:
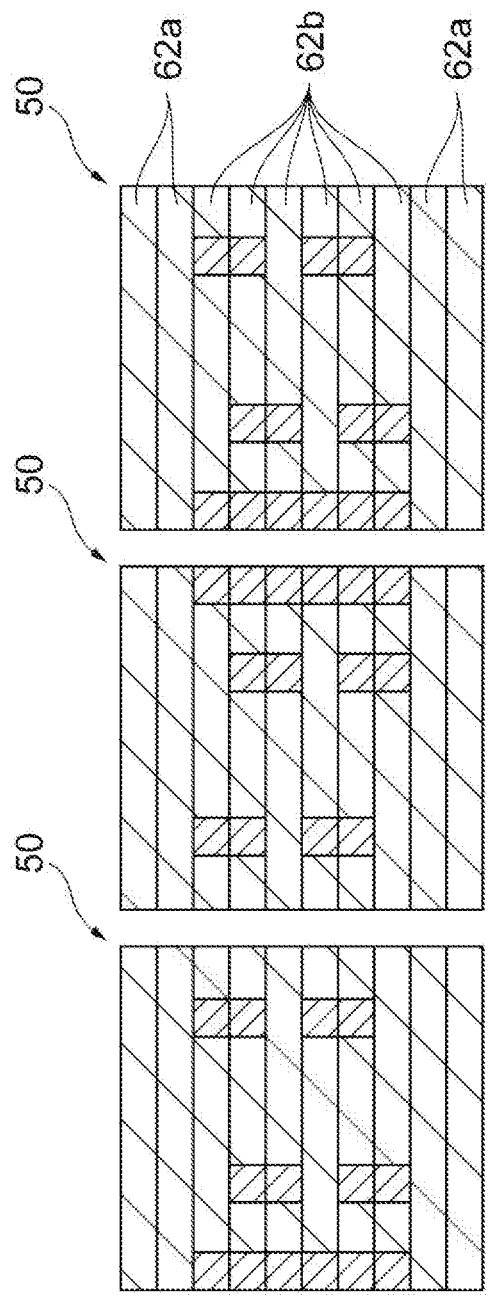

In the above manner, the laminates 50 are formed on each of the regions R1. Next, as shown in FIG. 12B, the laminates 50 are released from the region R1 (step S30), and then the laminates 50 are subjected to heat treatment (step S40). The laminated coil component 1 is thereby obtained. Residues may be are produced because the element-body resist layer 61 and the conductor resist layer 71 which are formed in the region R2 are not removed due to narrow spaces L1 and L2. In this case, residue removing treatment may be performed as necessary. As residue removing treatment, washing treatment or polishing treatment such as barrel polishing can be performed, for example. Barrel polishing is performed, for example, after the step S30 and before the step S40.

As described above, also in the second embodiment, since a cutting step is not required as in the first embodiment, it is possible to improve a yield. In the first embodiment, the element-body patterns 62*a* and 62*b*, and the conductor pattern 72 are formed on the substrates 60 and 70, and then are transferred onto the substrate 40. As compared with the first embodiment, in the second embodiment, it is possible to suppress positional deviation in the direction (directions D1 and D2) orthogonal to the laminating direction (direction D3) since the positional accuracy at the time of lamination is higher. In the second embodiment, the pressing step is not required since laminates having a high adhesion between layers can be formed as the laminates 50. In the second embodiment, since the laminates 50 can be formed only with the substrate 40, it is easier to perform manufacturing in a narrower working space as compared with the first embodiment.

The present invention is not limited to the embodiments described above, and various modifications can be made.

The element-body patterns 62*a* and 62*b*, and the conductor pattern 72 may be formed by, for example, a printing method instead of the photolithography method. The element-body patterns 62*a* and 62*b*, and the conductor pattern 72 are not necessarily fortified on different substrates 60 and 70, and may be formed on a common substrate as long as the element-body patterns 62*a* and 62*b*, and the conductor pattern 72 are apart from each other.

Figure 13:
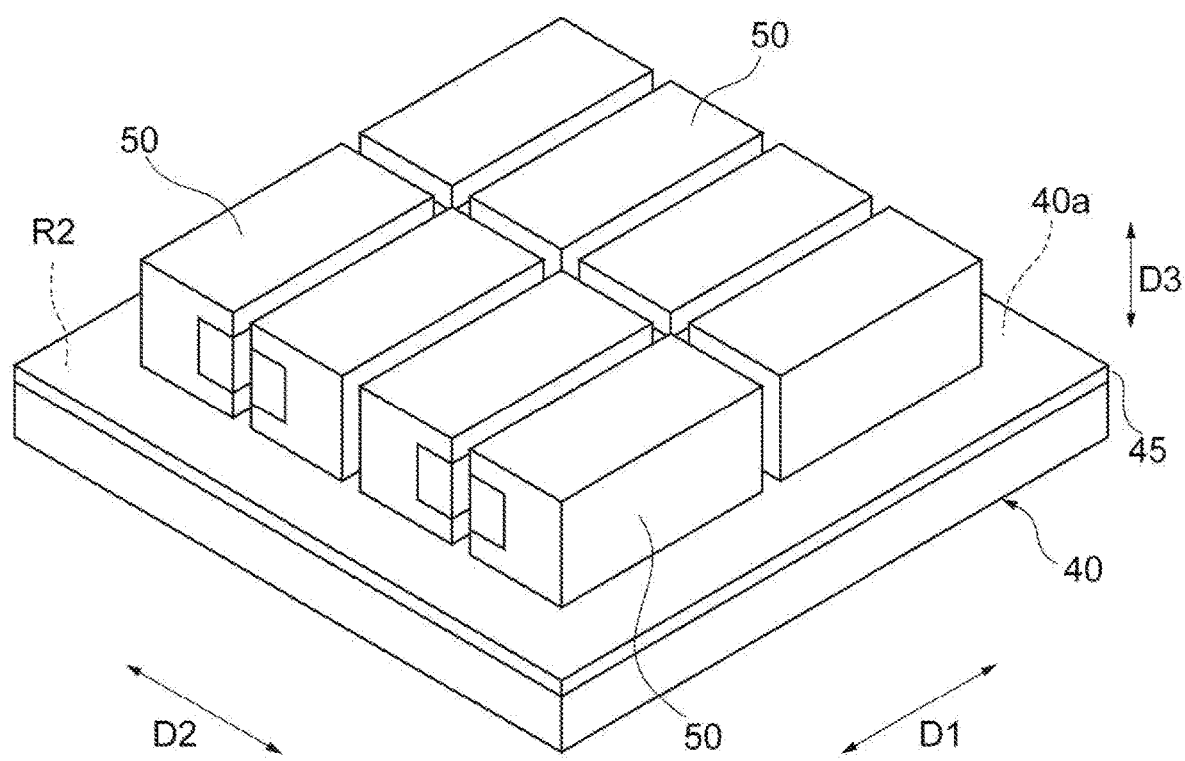
FIG. 13 is a diagram explaining a method for manufacturing a laminated coil component according to a modified example.

FIG. 13 is a diagram explaining a method for manufacturing a laminated coil component according to a modified example. As shown in FIG. 13, in the step S10 of forming the laminates 50, the laminates 50 may be formed on each of the regions R1 via a release layer 45. In this case, the laminates 50 can be easily released from the regions R1. The release layer 45 may be provided over a plurality of regions R1 or may be provided for each of the regions R1.

In the first embodiment and the second embodiment described above, the laminated coil component 1 has been described as an example of an electronic component, but the present invention is not limited to this. The present invention can be applied to a method for manufacturing other electronic components such as multilayer ceramic capacitors, laminated varistors, laminated piezoelectric actuators, laminated thermistors, and laminated composite components.

What is claimed is:

1. An electronic-component manufacturing method for simultaneously manufacturing a plurality of electronic components, each of the electronic components including an element body and a conductor, each of the electronic components including a coil in the corresponding element body, each conductor including coil conductors, the coil conductors of the conductor of an electronic component of the electronic components constituting the coil of that electronic component, the electronic-component manufacturing method comprising the steps of:

simultaneously forming a plurality of laminate components to be the plurality of electronic components on a plurality of regions on a surface of a first substrate, the plurality of regions being apart from each other when viewed in a direction perpendicular to the surface, each of the plurality of laminate components having a plurality of laminates laminated in the direction perpendicular to the surface;

releasing the laminate components from the plurality of regions; and performing heat treatment to the laminate components to form the plurality of electronic components, wherein the forming the laminate components comprises:

a first step of simultaneously forming, on the plurality of regions, a plurality of element-body patterns, each of the plurality of element-body patterns corresponding to the element body of a respective one of the plurality of electronic components, containing a constituent material of the element body, and patterned for a respective one of the plurality of regions; and a second step of simultaneously forming, on the plurality of regions, a plurality of conductor patterns, each of the plurality of conductor patterns corresponding to the conductor of a respective one of the plurality of electronic components, containing a constituent material of the conductor, and patterned for a respective one of the plurality of regions, the formed conductor extending two or more laminates of the plurality laminates.

2. The electronic-component manufacturing method according to claim 1, wherein the element-body patterns are formed by a photolithography method in the first step, and the conductor patterns are formed by the photolithography method in the second step.

3. The electronic-component manufacturing method according to claim 2, wherein the element-body pattern are formed on a second substrate by the photolithography method, and then the element-body patterns are transferred onto the plurality of regions in the first step, and the conductor patterns are formed on a third substrate by the photolithography method, and then the conductor patterns are transferred onto the plurality of regions in the second step.

4. The electronic-component manufacturing method according to claim 2, wherein a first resist layer containing the constituent material of the element body is formed over the plurality of regions, and then the first resist layer is patterned by the photolithography method in the first step, and a second resist layer containing the constituent material of the conductor is formed over the plurality of regions, and then the second resist layer is patterned by the photolithography method in the second step.

5. The electronic-component manufacturing method according to claim 2, wherein the conductor of each of the electronic components includes a mounting conductor that is exposed from the corresponding element body.

6. The electronic-component manufacturing method according to claim 1, wherein the laminate components are formed on the plurality of regions via a release layer in the forming the laminate components.

7. The electronic-component manufacturing method according to claim 1, wherein the laminate components are formed on the plurality of regions set to have a space of 100 µm or less between each of the plurality of regions in the forming the laminate components.

8. The electronic-component manufacturing method according to claim 1, wherein the conductor patterns are formed in such a way as to extend along outer edges of the plurality of regions when viewed from a direction orthogonal to the plurality of regions in the second step.

9. The electronic-component manufacturing method according to claim 1, wherein the coil of each of the electronic components is a three dimensional screw coil and is constituted by laminated coil conductors.

10. The electronic-component manufacturing method according to claim 1, wherein the plurality of electronic components is manufactured to be used separately.

* * * * *